United States Patent [19]

Kosonocky et al.

[11] 4,237,383
[45] Dec. 2, 1980

[54] HIGH SPEED LOADING OF OUTPUT REGISTER OF CCD ARRAY SYSTEM

[75] Inventors: Walter F. Kosonocky, Skillman; Rodney L. Angle, Somerville, both of N.J.

[73] Assignee: RCA Corporation, New York, N.Y.

[21] Appl. No.: 944,013

[22] Filed: Sep. 20, 1978

[51] Int. Cl.³ .............................................. H01J 40/14
[52] U.S. Cl. ................................ 250/578; 307/221 D
[58] Field of Search ............. 250/211 S, 578; 357/24, 357/29, 30, 31, 32; 307/221 D, 238, 311; 365/183

[56] References Cited

U.S. PATENT DOCUMENTS

| | | |
|---|---|---|
| 3,811,055 | 5/1974 | Weimer . |
| 3,873,851 | 3/1975 | Weimer . |
| 3,953,837 | 4/1976 | Cheek ............................ 307/221 D |
| 3,971,003 | 7/1976 | Kosonocky . |
| 3,988,613 | 10/1976 | Brown et al. ..................... 250/211 J |

*Primary Examiner*—David C. Nelms
*Attorney, Agent, or Firm*—Samuel Cohen; H. Christoffersen

[57] ABSTRACT

The output register of a CCD imager system is loaded at high speed by, for each row of charges, first translating the m charges in each group of m adjacent ones of the n columns of the imager into m serially occurring charges and temporarily storing each group of m serially occurring charges in a separate CCD register. The time available for the translation and temporary storage is equal to the time required serially to read out the output register. The n/m temporarily stored groups of charges are then concurrently serially shifted from the n/m registers in which they are stored to the output register which comprises m parallel registers, each with n/m stages. This shifting for loading the register can be performed at very high speed.

4 Claims, 2 Drawing Figures

HIGH SPEED LOADING OF OUTPUT REGISTER OF CCD ARRAY SYSTEM

The invention described herein was made under a contract with the Department of the Navy.

This invention relates to charge coupled device (CCD) arrays and, in particular, to the transfer of charge at high speed out of a densely packed array. The invention is applicable, for example, to memories and imagers but is discussed, for purposes of this application, in terms of a high resolution imager.

A CCD imager comprises columns and rows of image sensing locations, the columns separated from one another by potential barriers such as those formed by so-called channel stops. The horizontal resolution of the imager is a function of how close the columns can be placed to one another and this, in turn, is affected by the system design, particularly that of the output register. The latter receives charges, in parallel, from the CCD imager system, and these subsequently are shifted out of the register in serial fashion.

A straightforward approach to the parallel transfer to the output register is to transfer one complete row at a time. Each column of the imager then serves as a source for the charge for one stage of the output register. This limits the center-to-center spacing of the columns of the CCD imager to the length of each output register stage, that is, each column must be spaced at least as far, center-to-center, from the adjacent column as the length of an output register stage, even though modern photolithographic techniques are available to reduce the column width to a value lower than this.

U.S. Pat. No. 3,971,003 for "Charge Coupled Device Imager," by Walter F. Kosonocky, one of the present inventors, describes CCD imagers with improved horizontal resolution. For example, in the imager shown in FIG. 8 of the patent, the output register, which is a three-phase register, is sub-divided into m parallel registers, where m=3 in this example. Each column of the imaging system is aligned with one electrode of the three electrodes making up a stage of each register. Each row of charges is shifted out of the imager system, 1/m'th of a row at a time, rather than a complete row at a time. First one third of the row is shifted to one of the output registers and the other two thirds of the row is temporarily stored in the output gating structure. Then a second third of the row (interleaved with the first third of the row) is shifted from the output gating structure to the second output register. Finally, the last third of the row, interleaved with the first and second thirds of the row, is shifted from the gating structure to the third output register.

While the system above does permit the columns of a CCD imager to be more closely packed and therefore does permit the resolution of the imager to be increased (by a factor of 3 in this particular example), the time available for the transfer of charges to the output register must be sufficient to permit the temporary storage and shifting of partial rows as described above. In the patented system, the charges serially read out of the output register are translated to the video signals of television and are displayed during one horizontal line time. The time available for the transfer of a new row of charges from the imager system to the output register, is not greater than the horizontal retrace time. In commercial television, the horizontal retrace time is about 10 $\mu s$ and this is adequate to permit this kind of transfer.

In a certain high speed CCD imager system designed for another purpose, the time corresponding to the horizontal retrace time discussed above, that is, the time available for loading the output register, is of the order of 2 $\mu s$ or less. This is insufficient to permit the loading of the output register in the manner described above.

In a system embodying the invention, each group of m adjacent columns of charges in a row is multiplexed to provide m serially occurring charges, where m is a relatively small integer compared to the number n of columns in the imager. The n/m groups of serially occuring charges thereby produced, are shifted into n/m CCD registers where they are temporarily stored. The time available for the multiplexing and temporary storage is relatively long, equivalent to a line time of the system. The temporarily stored charges then are concurrently shifted into m output register, each temporary storage register being aligned with one stage of an output register (each temporary storage register, however, storing the charges from m adjacent columns). The shifting can take place at high speed during the period corresponding to the horizontal retrace period of the system which, as all charges concurrently are propagated to effect the loading of the output register, can be substantially smaller than the horizontal retrace period of the prior art system discussed above. In the drawing:

Figure 1:
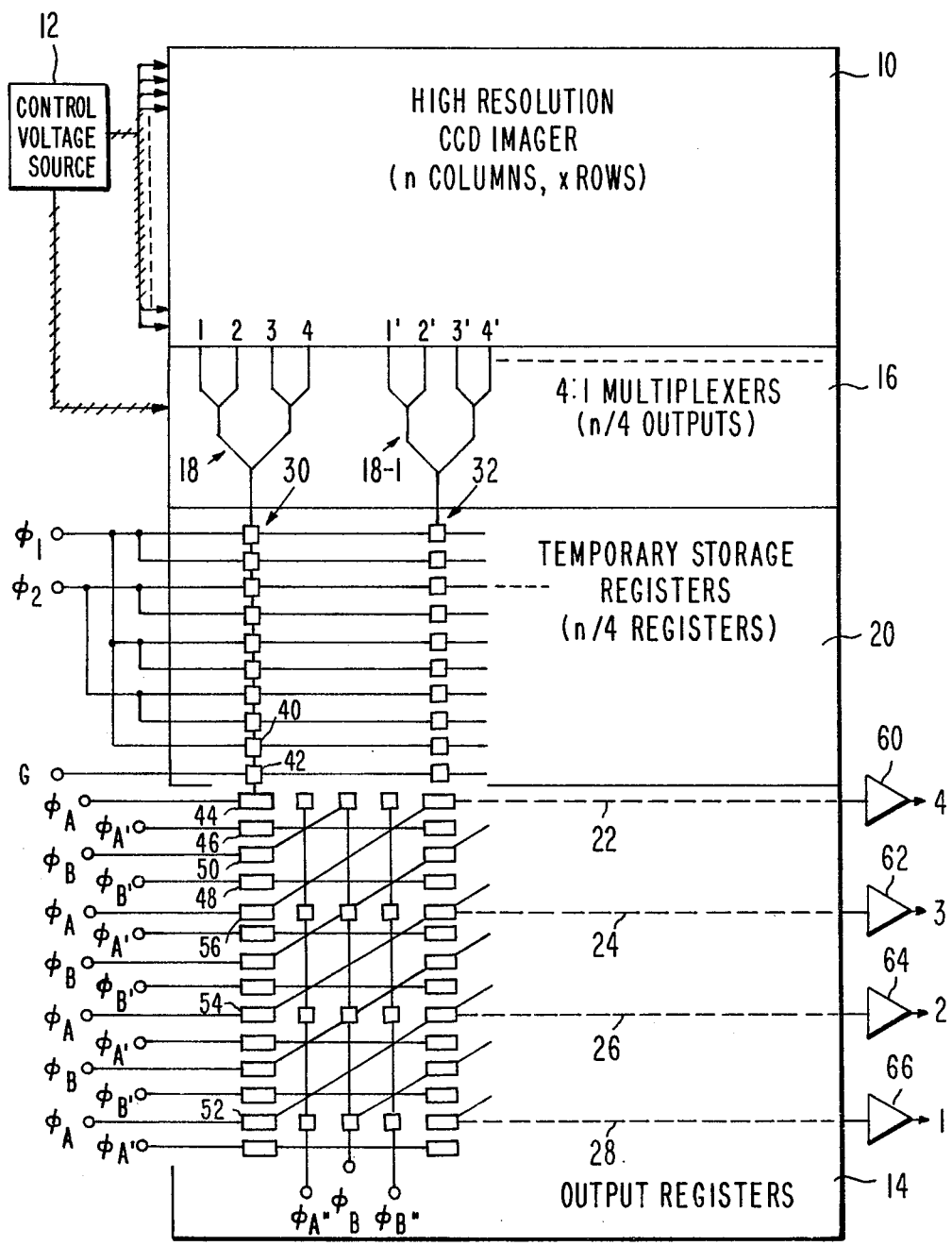
FIG. 1 is the schematic showing of a system embodying the invention.

Referring to FIG. 1, the system illustrated includes a high resolution CCD imager in which there are n columns and x rows. In one particular design, the imager includes 2,200 columns and 96 rows and is operated in the time delay integration (TDI) mode. In this particular application, the imager is designed to read a document which is propagated at high speed past the imager, in the column direction of the imager, and while the document is moving, the clock voltages applied by control voltage source 12 to the imager, cause the potential wells produced by the electrodes of the imager, to move also in the column direction at the same relative speed as the document. The result of operation in this way is to provide the effect of a stationary document which is imaged onto a stationary imager. While this particular imager is designed to operate in TDI fashion, as far as the present invention is concerned, the techniques to be described are equally suitable for other forms of CCD imagers. In whatever CCD imager system employed, during the integration time, an image is projected onto the imager and the photons reaching the substrate cause the excitation of electron-hole pairs and the charge carriers of interest thereby produced (which may be either the holes or the electrons, depending on the design) become stored as a charge pattern corresponding to the image. The imager may be one of the surface or buried channel type. It may have any of the well-known electrode structures.

Upon the completion of the integration time, the charges must be propagated from the imager to the output registers 14. The present system includes n/4 multiplexers 16, each for translating the parallel charges appearing in four adjacent columns in the imager 10 to four serially occurring charges. Each multiplexer, such as 18, may comprise a converging tree network and it translates the four charges 1, 2, 3, 4 appearing in four adjacent columns to four serially occurring charges which appear in the order 1, 3, 2, 4. Suitable such networks are described in copending application Ser. No. 916,208 (RCA 72,503) for "CCD Gate Electrode Structure and System Employing the Same," filed June 16, 1978, by Walter F. Kosonocky and Donald J. Sauer, and in copending application Ser. No. 916,079 (RCA 72,358) for "CCD Multiple Channel Network," filed June 16, 1978, by Rodney L. Angle. Both applications are assigned to the same assignee as the present application.

Figure 2:
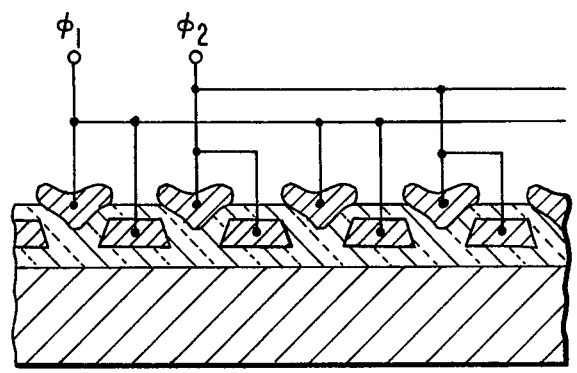
FIG. 2 is a section through a CCD showing, in a more realistic way, one kind of electrode structure which may be employed in the system of FIG. 1.

The multiplexers 16 are followed by n/4 CCD registers 20, each such register for storing the four serially occurring charges produced by a multiplexer. The registers comprise four parallel registers 22, 24, 26 and 28. They may be two-phase operated registers, as shown, however, this is to be understood as an example only. The electrodes here and in the output registers are shown as rectangles and this is intended to be schematic. In practice, an overlapping gate electrode structure such as shown in FIG. 2, may be employed for the registers 20 and similar structure may be employed for the output registers and in the remainder of the system. Alternatively, any one of a number of conventional CCD electrode structures may be used.

In the operation of the system of FIG. 1, during the integration time charges are accumulated in the imager, that is, charges representing the image projected onto the imager. Following the integration time, the charges are propagated through the multiplexers 16 to the temporary storage registers. The shifting of charges through the respective multiplexers for translating each group of four parallel charges into four serially occurring charges, is controlled by the control voltage source 12 which supplies clock voltages to the imager, and to the multiplexers as described in the copending applications. The solid lines in multiplexer 16 indicate the CCD channels and the gate electrode structures which pass over the respective channels, are not shown explicitly to avoid cluttering up the drawing. Details of such electrode structures are given in the copending applications. Further, while the multiplexers of the copending applications are preferred in the present application, it is to be understood that other parallel-to-serial converters, that is, multiplexers, may be employed instead.

Upon exiting from the multiplexers, the two two-phase voltages $\phi_1$, $\phi_2$ applied to the electrodes of the temporary storage registers 20 cause the serial charges to shift into the respective temporary storage registers 20. Thus, the charges from multiplexer 18, which are the charges in the first group 1–4 of four columns, are shifted into the first temporary storage register 30; the charges from the second multiplexer 18-1, which multiplexes the charges in the second group of four columns 1', 2', 3', 4', are shifted into the following register 32 and so on.

The time available for multiplexing and temporary storage is relatively long and corresponds to one line time, that is, the time available is equal to the time for serially reading out the output register. In the particular system given by way of example, the line time has a duration of 26 $\mu$s.

In the particular system given by way of example, the time available for reloading the output registers is very short, of the order of 2 $\mu$s or less. This reloading can be accomplished in such a short interval with the system design as shown. During reloading, $\phi_{A''}$ and $\phi_{B''}$ are maintained at potentials such as to provide potential barriers in the substrate so as to isolate the columns of the output registers from one another. $\phi_A$, $\phi_{A'}$, $\phi_B$ and $\phi_{B'}$ are then operated in conventional two-phase fashion. In other words, $\phi_A$ goes on at one level and $\phi_{A'}$ at a higher level (the two waveforms are of the same shape and phase but $\phi_{A'}$ is of higher amplitude than $\phi_A$ during this phase of the operation) to effect the transfer of charge from beneath an electrode such as 40 via a transfer gate 42 and via transfer electrode 44 to storage electrode 46. During such transfer, of course, the gate voltage G is sufficiently high to produce a conduction path beneath transfer electrode 42 to permit such transfer to take place. After the transfer above, $\phi_A$ and $\phi_{A'}$ go low but the substrate bias causes charge to remain stored beneath storage electrode 46. Subsequently, $\phi_B$ goes high and $\phi_{B'}$ goes higher (here too, $\phi_B$ and $\phi_{B'}$ are of the same shape and phase but $\phi_{B'}$ is of higher amplitude than $\phi_{B'}$ during this phase of the operation) to propagate charge from the potential well beneath transfer electrode 46 to the storage potential well beneath storage electrode 48 via the conduction channel beneath transfer electrode 50.

This process continues until the four charges 4, 2, 3, 1 become stored beneath the four transfer electrodes 44, 56, 54 and 52, respectively, and the corresponding charges from the other temporary storage registers are stored in the remaining columns of the output registers. The charges which pass to the potential wells beneath these four transfer electrodes are prevented from moving further by holding the voltages $\phi_{A'}$ and $\phi_{B'}$ applied to storage electrodes 46 and so on, at a level at which a barrier is present in the substrate beneath the $\phi_{A'}$ and $\phi_{B'}$ electrodes, when the last of the charges (from column 4) reaches electrode 44. Thus, the loading of the output registers takes place in somewhat less than four shift periods and these less than four shift periods can have a total duration of 2 $\mu$s or less.

After the loading of the output registers, the charges stored therein are shifted out in conventional fashion. During the readout, the voltages $\phi_{A'}$ and $\phi_{B'}$ are held at a value such that potential barriers are placed between the registers 22, 24, 26 and 28. Charge is propagated to the right by continuing the application of the $\phi_A$ and $\phi_B$ voltages while applying the multiple phase voltages $\phi_{A''}$ and $\phi_{B''}$. In other words, by making $\phi_A$ high and $\phi_{A''}$ higher, charge is propagated from beneath the $\phi_A$ transfer electrodes to beneath the $\phi_{A''}$ storage electrodes. Subsequently, by manipulating $\phi_B$ and $\phi_{B''}$ in similar fashion, that is, making $\phi_B$ high and $\phi_{B''}$ higher, after the $\phi_A$ and $\phi_{A''}$ voltages have been lowered, charge propagates from beneath the $\phi_{A''}$ storage electrodes via the $\phi_B$ transfer electrodes to beneath the $\phi_{B''}$ storage electrodes. In one practical design, the readout frequency employed for the output registers which were buried channel registers, was roughly 20 MHz.

Each charge in an output register may be sensed at an output stage of the register by, for example, employing a floating diffusion and conventional reset structure therefor (neither one being shown explicitly). The respective output stages may be connected to four amplifiers 60, 62, 64 and 66 for producing the four video signals read in parallel from the four registers. In one particular system, the four video signals were intended for storage in an analog memory for later readout and transmission of the stored information. However, the other forms of systems, the video information may be reconstituted to produce the n sequential video signals corresponding to the row read out of the imager, and the latter displayed on the screen of a kinescope, recorded in a suitable storage medium, or transmitted.

What is claimed is:

1. A method for transferring charges from a charge-coupled device (CCD) array comprising a semiconductor substrate, n columns of channels in the substrate, each channel comprising a substrate region defined by potential barriers in the substrate at the channel edges, and electrodes over the channels responsive to applied voltages for the storage of rows of charges in the channels and the propagation of said rows of charges along the channels, in the column direction, comprising the steps of:

translating the n charges in a row of the array, into n/m groups of m serial charges, where each group of m serial charges originates in m adjacent columns, and where m and n are integers and m is greater than 1 and is much smaller than n;

providing m CCD output registers each with n/m stages; and concurrently serially shifting the n/m groups of serial charges into the respective n/m stages of the output registers, the corresponding charges in the respective groups being shifted in parallel into the output register into which they are stored, each charge in each group of serial charges being concurrently shifted into the same stage of a different output register, whereby upon the completion of the serial shifting, each output register stores 1/m'th of a row of charges from each m'th column of the array.

2. A method as set forth in claim 1, wherein said array comprises a CCD imager.

3. A system for transferring charges from a charge-coupled device (CCD) array comprising a semiconductor substrate, n columns of channels in the substrate, each channel comprising a substrate region defined by potential barriers in the substrate at the channel edges, and electrodes over the channels responsive to applied voltages for the storage of rows of charges in the channels and the propagation of said rows of charges along the channels, in the column direction, comprising n/m CCD temporary storage shift registers, each with m stages;

n/m parallel-to-serial converter means for translating the n charges in a row of the array, into n/m groups of m serial charges, each group of m serial charges originating in m adjacent columns, and where m and n are integers and m is greater than 1 and is much smaller than n;

means for concurrently serially shifting said n/m groups of charges into said n/m temporary storage registers, respectively;

m CCD output registers, each with n/m stages; and means for concurrently serially shifting the charges stored in said n/m registers into the respective n/m stages of the m CCD output registers, each charge in each group of serial charges being shifted into the same stage of a different output register so that upon the completion of the concurrent shifting each output register stores n/m'th of a row of charges from each m'th column of the array.

4. A system as set forth in claim 3, wherein said CCD array comprises a CCD imager.

* * * * *